(12) United States Patent
Sato et al.

(10) Patent No.: US 11,274,045 B2
(45) Date of Patent: Mar. 15, 2022

(54) SPHERICAL CRYSTALLINE SILICA PARTICLES AND METHOD FOR PRODUCING SAME

(71) Applicant: NIPPON STEEL CHEMICAL & MATERIAL CO., LTD., Tokyo (JP)

(72) Inventors: Yutaka Sato, Tokyo (JP); Katsumasa Yagi, Himeji (JP); Mutsuhito Tanaka, Himeji (JP); Shozo Tokuda, Himeji (JP); Masanori Ae, Himeji (JP)

(73) Assignee: NIPPON STEEL CHEMICAL & MATERIAL CO., LTD., Tokyo (JP)

( * ) Notice: Subject to any disclaimer, the term of this patent is extended or adjusted under 35 U.S.C. 154(b) by 185 days.

(21) Appl. No.: 16/603,062

(22) PCT Filed: Mar. 30, 2018

(86) PCT No.: PCT/JP2018/013881
§ 371 (c)(1),
(2) Date: Jan. 24, 2020

(87) PCT Pub. No.: WO2018/186308
PCT Pub. Date: Oct. 11, 2018

(65) Prior Publication Data
US 2020/0148544 A1 May 14, 2020

(30) Foreign Application Priority Data
Apr. 5, 2017 (JP) ............... JP2017-075535

(51) Int. Cl.
*C01B 33/18* (2006.01)
*C01B 33/12* (2006.01)

(52) U.S. Cl.
CPC .............. *C01B 33/18* (2013.01); *C01B 33/12* (2013.01); *C01P 2004/32* (2013.01); *C01P 2004/61* (2013.01)

(58) Field of Classification Search
CPC ..................................................... C01B 33/12
See application file for complete search history.

(56) References Cited

U.S. PATENT DOCUMENTS

| | | | |
|---|---|---|---|
| 4,529,430 A * | 7/1985 | Lazarev | C01B 33/12 65/21.1 |
| 4,591,575 A * | 5/1986 | Okabayashi | C30B 29/22 501/154 |
| 4,701,479 A | 10/1987 | Shiobara et al. | |
| 2007/0248522 A1 | 10/2007 | Kuehn et al. | |
| 2010/0147027 A1 | 6/2010 | Kuehn et al. | |
| 2015/0284254 A1 * | 10/2015 | Jiang | C30B 29/18 423/339 |
| 2017/0267900 A1 | 9/2017 | Sato et al. | |

FOREIGN PATENT DOCUMENTS

| | | |
|---|---|---|
| CN | 102618926 A | 8/2012 |
| EP | 0601594 A | 6/1994 |
| JP | 59-203720 A | 11/1984 |
| JP | 61-268750 A | 11/1986 |
| JP | 7-96165 A | 4/1995 |
| JP | 10-297914 A | 11/1998 |
| JP | 2001-172472 A | 6/2001 |
| JP | 2005-231973 A | 9/2005 |
| JP | 2006-306691 A | 11/2006 |
| JP | 2007-290950 A | 11/2007 |
| WO | WO 2016/031823 A1 | 3/2016 |

OTHER PUBLICATIONS

International Preliminary Report on Patentability and Written Opinion of the International Searching Authority(Forms PCT/IB/326, PCT/IB/373 and PCT/ISA/237), dated Oct. 8, 2019, for International Application No. PCT/JP2018/013881, with an English Translation.
International Search Report, dated Jan. 18, 2018, for International Application No. PCT/JP2018/013881, with an English translation.
Higuchi et al., "Effect of Alkali Metal Oxide Addition on Crystallization and Phase Transformation of Sintered Spherical Silica", Journal of the Ceramic Society of Japan, vol. 105, No. 5, 1997, pp. 385-390 (6 pages with abstract).
Okabayashi et al.,"Preparation of Sperical Particles with Quartz Single Crystal", Chemistry Letters, vol. 43, No. 1, 2005, pp. 58-59 ( 2 pages).

* cited by examiner

*Primary Examiner* — Alexandre F Ferre
(74) *Attorney, Agent, or Firm* — Birch, Stewart, Kolasch & Birch, LLP

(57) ABSTRACT

Provided are: spherical crystalline silica particles which ensure higher productivity and lower production costs than conventional ones, contain plenty of quartz having high thermal conductivity, have high fluidity, high dispersibility, high filling property, and low abrasion property, and are also applicable to semiconductor field; and a method for producing the spherical crystalline silica particles. The crystalline silica particles are characterized in that with respect to the total mass of the particles, the content of a crystal phase is at least 90 mass % and the content of a quartz crystal is at least 70 mass %. In addition, at least one kind of alkali metals may be contained in an amount of 0.4-5 mass % in terms of oxides, with respect to the total mass of the particles. Furthermore, at least one kind of alkaline earth metals may be contained in an amount of 1-5 mass % in terms of oxides, with respect to the total mass of the particles.

19 Claims, No Drawings

SPHERICAL CRYSTALLINE SILICA PARTICLES AND METHOD FOR PRODUCING SAME

FIELD

The present invention relates to spherical crystalline silica particles and a method for producing the same, and particularly to spherical quartz crystal particles and a method for producing the same.

BACKGROUND

Silica particles are used as fillers for resins, for example, as fillers for semiconductor element sealing materials. As for the shape of the silica particles, when they have angular shape, the fluidity, dispersibility, and filling properties of the particles in the resin become poor. In order to improve these properties, spherical silica particles are widely used.

Generally, thermal spraying is used as a method for producing spherical silica. In thermal spraying, particles are melted by passing the particles through a high temperature region such as a flame, and the shape of the particles becomes spherical due to surface tension. The melted and spheroidized particles are recovered by airflow conveyance so that the particles are not fused together, while the particles after spraying are rapidly cooled. Since they are rapidly cooled from the molten state, the silica therein contains almost no crystals, has an amorphous structure, and forms glassy particles, generally called quartz glass.

Since spherical silica is amorphous, its thermal expansion coefficient and thermal conductivity are low. These physical properties are considered to be almost the same as the thermal expansion coefficient of quartz glass having an amorphous structure without a crystal structure, and the thermal expansion coefficient is 0.5 ppm/K, and the thermal conductivity is 1.4 W/mK.

Spherical silica particles generally used for a sealing material or the like are amorphous, and thus have a low coefficient of thermal expansion. Therefore, when mixed with a resin, there is an effect of reducing the coefficient of thermal expansion of the mixture (resin composition). As a result, the coefficient of thermal expansion of the resin composition can be brought close to that of the semiconductor element, and when the resin composition is used as a sealing material or the like, it is possible to suppress deformation that occurs during heating and cooling such as the resin curing process. However, the thermal conductivity of amorphous silica is not so high. Therefore, as the amount of heat generation increases as a result of higher performance of semiconductors, it is required to release the generated heat more efficiently. For this reason, spherical silica particles with higher thermal conductivity have been increasingly required.

Compared with amorphous silica, crystalline silica has a regular and dense structure, and therefore has a higher thermal conductivity. The crystal structure of silica includes cristobalite, quartz, tridymite, and the like. It is known that silica having these crystal structures has a higher thermal expansion coefficient and thermal conductivity than amorphous silica. In particular, since quartz has a denser crystal structure than other crystals, the thermal conductivity is as high as 12.8 W/mK, and spherical silica particles containing a large amount of quartz are considered to have a high thermal conductivity.

As a means for obtaining spherical crystalline silica particles, Patent Document 1 discloses a technique, wherein a dispersed phase liquid in which silica sol is dispersed is injected through pores into a continuous phase liquid that is not compatible with the dispersed phase liquid to form an emulsion, wherein a cake is formed by separating the dispersed phase from the emulsion, and wherein the cake obtained by the separation is fired in a temperature range of from 800° C. to 1300° C. in the presence of a crystallization agent containing at least one element selected from the group consisting of Ca, Y, La and Eu.

Further, Patent Document 2 discloses a technique capable of forming a cristobalite, wherein spherical fused silica is heated at a high temperature of 1200 to 1600° C., in particular 1300 to 1500° C. for 5 to 24 hours to reliably grow crystals, and then it is cooled slowly up to room temperature over 20 to 50 hours.

PRIOR ART DOCUMENT

Patent Document

PATENT DOCUMENT 1: Japanese Patent Publication (kokai) No. 2005-231973
PATENT DOCUMENT 2: Japanese Patent Publication (kokai) No. 2001-172472

SUMMARY

Problems to be Solved by the Invention

Semiconductor products are required to efficiently dissipate the generated heat. In order to cope with an increase in amount of heat generated by the semiconductor products especially with higher performance, a highly heat-conductive material which easily releases heat is required for the surrounding members such as semiconductor sealing materials, as well. For this reason, spherical crystalline silica having a high thermal conductivity and a high filling rate is useful as a filler used for a sealing material or the like.

As a method for obtaining spherical crystalline silica, a method for crystallizing amorphous spherical silica by heat treatment at a high temperature is disclosed. However, there is a problem that when heat treatment is performed at a high temperature, the silica particles are bonded together by fusing or sintering. Further, a method for producing and firing spherical particles in a liquid phase using silica sol or the like as a raw material has been disclosed, but there is a problem that productivity is low and manufacturing cost is high for the method.

Patent Document 1 proposes a method for obtaining crystalline silica by passing a silica sol dispersion through pores to form a spherical emulsion, followed by gelation and heat treatment. In the method of Patent Document 1, since steps for separating and drying the emulsion are added, the productivity of the method is low, and an expensive silica sol is used as a raw material, resulting in an increase in manufacturing cost. In addition, the crystalline silica obtained by this method is composed of α-quartz and cristobalite as a crystal phase having a proportion of α-quartz of 24 to 67% and a large amount of cristobalite crystals. Cristobalite has a density of 2.33 g/cm$^3$, which is considerably lower than 2.65 g/cm$^3$ of α-quartz, and its crystal structure is less dense than that of cα-quartz, and thus has a low thermal conductivity. For this reason, in order to obtain spherical crystalline silica having higher heat conductivity, spherical crystalline silica having a higher α-quartz content is required.

Patent Document 2 discloses a method for make cristobalite, wherein spherical fused silica is heated at a high temperature of 1200 to 1600° C., particularly 1300 to 1500° C. for 5 to 24 hours to reliably grow crystals, and then, it is slowly cooled to room temperature over 20 to 50 hours. In this method, it is necessary to cool slowly over 20 to 50 hours for cooling step, the productivity is low, and the obtained spherical silica particles are cristobalite.

As described above, in the technology disclosed heretofore, crystalline spherical silica particles containing a large amount of quartz crystal having a high thermal conductivity cannot be obtained, and the raw material cost and manufacturing cost are high. Therefore, it is necessary to develop inexpensive manufacturing technologies wherein the resulting particles contain a large amount of quartz crystal having a high thermal conductivity. By using spherical silica particles containing a large amount of quartz crystal having a high thermal conductivity, an effect of releasing heat generated in the semiconductor element can be obtained when mixed with a resin to be used as a sealing material or the like. In addition, cristobalite and tridymite undergo a phase transition in the temperature range of 200 to 250° C. and 120 to 200° C., respectively, and volume expansion occurs due to the phase transition. As a result, in the heating process such as curing and reflow of the mixture of the silica particles with the resin, voids may be generated between the resin and the silica particles, or the mixture of the particles with the resin may cause cracks or fracture. For this reason, it is important to contain a large amount of quartz crystals, and reduce the crystal content of cristobalite and tridymite.

An object of the present invention is to provide spherical crystalline silica particles, which contain a large amount of quartz having a high thermal conductivity, has high fluidity, high dispersibility and high filling property, and can be applied to the semiconductor field and a method for producing the same, which has higher productivity and lower manufacturing cost as compared to the prior art.

Means for Solving the Problems

As a result of intensive investigations to solve the above problems, the inventor has found that "by adding a predetermined proportion of an alkali metal or alkaline earth metal compound to the raw material, spherical crystalline silica particles wherein the content of a crystal phase is at least 90 mass % with respect to the total mass of the particles, and the content of a quartz crystal is at least 70 mass % with respect to the total mass of the particles" can be produced. As a result, the present inventors have found that spherical crystalline silica particles having a high thermal expansion coefficient, high thermal conductivity, high fluidity, high dispersibility and high filling property and applicable to the semiconductor field can be realized at higher productivity and lower production cost than the conventional method, which led to the present invention.

The gist of the present invention is as follows.

[1]
Spherical crystalline silica particles characterized in that the content of a crystal phase is 90% by mass or more with respect to the total mass of the particles, and the content of a quartz crystal is 70% by mass or more with respect to the total mass of the particles.

[2]
The spherical crystalline silica particles according to item [1], characterized in that they contain 0.4 to 5% by mass of at least one alkali metal in terms of oxide thereof.

[3]
The spherical crystalline silica particles according to item [2], characterized in that the alkali metal is Li.

[4]
The spherical crystalline silica particles according to item [1], characterized in that they contain 1 to 5% by mass of at least one alkaline earth metal in terms of oxide thereof with respect to the total mass of the particles.

[5]
The spherical crystalline silica particles according to item [4], characterized in that the alkaline earth metal is Ca.

[6]
The spherical crystalline silica particle according to any one of items [1] to [5], characterized in that they contain 50 to 5000 ppm of aluminum in terms of metallic aluminum.

[7]
The spherical crystalline silica particles according to any one of items [1] to [6], characterized in that their average particle diameter (D50) is 1 to 100 μm.

[8]
The spherical crystalline silica particles according to any one of items [1] to [7], characterized in that their average circularity is 0.88 or more.

[9]
A method for producing spherical crystalline silica particles, characterized in that it comprises steps of:
mixing amorphous spherical silica particles with an alkaline metal compound in a proportion of the alkaline metal in an amount of 0.4 to 5% by mass in terms of oxide thereof, based on the total mass of the mass of the amorphous spherical silica particles and the mass of the alkaline metal in terms of oxide thereof,
heat treating the mixed spherical silica particles at 800 to 1300° C., and
cooling the heat treated spherical silica particles,
wherein the cooled spherical silica particles contain 90% by mass or more of a crystal phase, and the content of a quartz crystal is 70% by mass or more with respect to the total mass of the particles.

[10]
The method for producing spherical crystalline silica particles according to item [9], characterized in that the alkali metal is Li.

[11]
The method for producing spherical crystalline silica particles according to item [10], characterized in that the alkali metal compound is $Li_2CO_3$.

[12]
A method for producing spherical crystalline silica particles, characterized in that it comprises steps of:
mixing amorphous spherical silica particles with an alkaline earth metal compound in a proportion of the alkaline earth metal in an amount of 1 to 5% by mass in terms of oxide thereof, based on the total mass of the mass of the amorphous spherical silica particles and the mass of the alkaline earth metal in terms of oxide thereof,
heat treating the mixed spherical silica particles at 800 to 1300° C., and
cooling the heat treated spherical silica particles,
wherein the cooled spherical silica particles contain 90% by mass or more of a crystal phase, and the content of a quartz crystal is 70% by mass or more with respect to the total mass of the particles.

[13]
The method for producing spherical crystalline silica particles according to item [12], characterized in that the alkaline earth metal is Ca.

[14]

The method for producing spherical crystalline silica particles according to item [13], characterized in that the alkaline earth metal compound is $CaCO_3$ or $Ca(OH)_2$.

[15]

The method for producing spherical crystalline silica particles according to any one of items [9] to [14], characterized in that the amorphous spherical silica particles containing 50 to 5000 ppm of aluminum in terms of metallic aluminum are used.

[16]

The method for producing spherical crystalline silica particles according to any one of items [9] to [15], characterized in that the spherical crystalline silica particles are produced so that their average particle diameter (D50) is from 1 to 100 μm.

[17]

The method for producing spherical crystalline silica particles according to any one of items [9] to [16], wherein the spherical crystalline silica particles are produced so that their average circularity is 0.88 or more.

Effect of the Invention

According to the present invention, spherical crystalline silica particles, which contain a large amount of quartz having a high thermal conductivity, high fluidity, high dispersibility and high filling property, and can be applied to the semiconductor field and a method for producing the same, which has higher productivity and lower manufacturing cost as compared to the prior art are provided.

EMBODIMENTS TO CARRY OUT THE INVENTION

The silica particles of the present invention contain 90% by mass or more of a crystal phase. Since the thermal conductivity of amorphous silica is as low as 1.4 W/mK, when the amorphous silica is contained in an amount of more than 10% by mass, the thermal conductivity of the silica particles is lowered. In addition, the crystal phase contains quartz crystal in an amount 70% by mass or more based on the total mass of the particles in which contain amorphous phase. As a crystal phase other than the quartz crystal, cristobalite and tridymite may be included. Any of crystals has a thermal conductivity of about 10 W/mK, which is lower than that of quartz, but higher than that of amorphous silica. If 90% by mass or more of the entire particles is composed of a crystal phase and 70% by mass or more of the entire particles is composed of quartz crystals, the desired spherical silica particles having a high thermal conductivity can be obtained. Further, when the content of cristobalite or tridymite is more than 30% by mass, a phase transition from a cristobalite to β cristobalite or from a tridymite to β1 tridymite and to β2 tridymite may occur. As a result, due to volume expansion accompanying the phase transition, when the silica particles are used by being mixed with a resin, a gap may be formed between the resin and the silica particles, or cracks or fracture of the particles may occur. Therefore, it is important to reduce the content of cristobalite and tridymite by making the amount of the quartz crystal 70% by mass or more based on the entire particles.

The crystal phase content and amorphous content, as well as the contents of quartz, cristobalite and tridymite can be quantitatively analyzed by X-ray diffraction. In the quantitative analysis by X-ray diffraction, quantitative analysis can be performed without using a standard sample by using an analytical method such as the Rietveld method.

The silica particles of the present invention may contain 0.4 to 5% by mass of alkali metal or 1 to 5% by mass of alkaline earth metal in terms of oxide. The alkali metal refers to lithium, sodium, potassium, rubidium, cesium and francium excluding hydrogen among elements belonging to Group 1 in the periodic table. The alkaline earth metal refers to beryllium, magnesium, calcium, strontium, barium and radium among elements belonging to Group 2 in the periodic table.

Although not bound by a specific theory, alkali metals and alkaline earth metals are considered to act as crystal nucleating agents during heat treatment. If the alkali metal content is less than 0.4% by mass or the alkaline earth metal content is less than 1% by mass, the crystallization promoting effect may not be sufficient.

On the other hand, alkali metals, in particular, are also known to have an effect of lowering the melting point of silica, and may be used, for example, as a melting point depressant for silica glass (so-called soda glass). Therefore, when the content of the alkali metal exceeds 5% by mass, the melting point of the silica particles is remarkably lowered, and the silica particles are easily bonded by fusion or sintering during the heat treatment. When the bonding between the particles proceeds, fluidity, dispersibility and filling property become insufficient when used as a filler for a semiconductor sealing material.

Further, when the content of the alkaline earth metal exceeds 5% by mass, the alkaline earth metal and silica react with each other, and, for example, in the case of magnesium, a silicate compound such as $Mg_2(SiO_4)$ is formed. Such a compound is easily formed on the outer peripheral portion of the particle, and the shape of the particle is deformed to reduce the circularity of the particle, or the silicate compound is present as an irregularly shaped fine particle. As a result, there is a possibility that the fluidity of the mixture with a resin is reduced.

The content of the alkali metal and alkaline earth metal can be measured, for example, by atomic absorption spectrometry or ICP mass spectrometry (ICP-MS).

In particular, it is desirable to use Li as the alkali metal contained in the silica particles of the present invention. This is because by using Li, crystalline silica particles having a high content of quartz crystals can be obtained at a low heat treatment temperature.

Also, when an alkali metal, particularly Li, is used, it is desirable to contain 50 to 5000 ppm of aluminum in terms of metallic aluminum. While not being bound by a specific theory, aluminum acts as a crystal nucleating agent during heat treatment, and can produce an effect of forming a large amount of quartz crystals when used with an alkali metal, particularly Li. When aluminum is less than 50 ppm in terms of metallic aluminum, the effect of promoting crystallization cannot be obtained. On the other hand, when the amount of aluminum is more than 5000 ppm in terms of metallic aluminum, a composite oxide of the alkali metal, particularly Li, Al and Si is likely to be formed. Therefore, the effect of adding the alkali metal, particularly Li, is reduced. At the same time, Al is increased and thus cristobalite is easily formed, and the amount of formation of quartz crystals is reduced. Furthermore, in order to reduce the amount of formation of cristobalite and to obtain crystalline spherical silica particles having a higher quartz content, it is more desirable that aluminum is present in the range of 50 to 1000 ppm in terms of metallic aluminum.

Incidentally, for adjusting the aluminum content, metallic aluminum or an aluminum compound may be mixed, but the silicastone which is a raw material for amorphous silica particles often contains an aluminum compound as an impurity. Therefore, it is also possible to prepare raw material silicastone or amorphous silica particles having a proper range of content in terms of metallic aluminum and adjust the content to the above-mentioned preferable range.

Moreover, it is desirable to use Ca as the alkaline earth metal contained in the silica particles of the present invention. This is because by using Ca, crystalline silica particles containing more quartz crystals can be obtained compared to the case of using other alkaline earth metals.

In addition, when an alkaline earth metal, particularly Ca, is used, it is desirable to contain 50 to 5000 ppm of aluminum in terms of metallic aluminum. While not being bound by a specific theory, aluminum acts as a crystal nucleating agent during heat treatment, and can produce an effect of forming a large amount of quartz crystals when used with an alkaline earth metal, particularly Ca. When an alkaline earth metal is used, crystallization is less likely to occur than when an alkali metal is used, but crystallization can be promoted by using aluminum. However, when the amount of aluminum is less than 50 ppm in terms of metallic aluminum, a sufficient effect of promoting crystallization cannot be obtained. Further, when the amount of aluminum is more than 5000 ppm in terms of metallic aluminum, complex oxides of alkaline earth metals, particularly Ca, Al and Si are likely to be formed, and thus the effect of adding alkaline earth metals, particularly Ca, is reduced. At the same time, the amount of Al is increased, and thus cristobalite is easily formed, and the amount of formation of quartz crystals decreases.

For a production method, as a result of including 0.4 to 5 mass % of alkali metal or 1 to 5 mass % of alkaline earth metal, crystallization of silica is realized by heating in a temperature range of 800 to 1300° C. for 1 to 24 hours, and then cooling at a rate of 100 to 300° C./hr. This cooling rate is applied in a temperature range from the temperature maintained for heat treatment to 500° C. to obtain a desired product. When the cooling rate is less than 100° C./hr, the cooling time becomes long, and the productivity may not be sufficient. When the cooling rate is more than 300° C./hour, the cooling rate is too high, and thus cracks may occur in the particles. The cooling rate may also be applied to a temperature range lower than 500° C. or may be applied to room temperature. This is because in the temperature range lower than 500° C., crystallinity, particle size and circularity hardly change.

The silica particles of the present invention may have an average particle diameter (D50) of 1 to 100 μm. When the average particle diameter exceeds 100 μm, when used as a filler for semiconductor encapsulating materials, the particle size becomes too coarse and gate clogging and mold wear may easily occur. When the average particle diameter is less than 1 μm, the particles may become too fine to be filled in a large amount. Here, the average particle diameter can be determined by particle size distribution measurement by a wet laser diffraction method (laser diffraction scattering method).

The average particle diameter referred to here is so-called the median diameter, and the particle diameter distribution is measured by a laser diffraction method, and the particle diameter at which the cumulative frequency of the particle diameter becomes 50% is defined as the average particle diameter (D50).

In order to obtain the above particle diameter range, it is possible to adjust the particle diameter of the raw material amorphous spherical silica particles (particles before crystallization). As for a thermal spraying means, the particle diameter can be easily adjusted. In other words, the average particle diameter of the silica particles of the present invention hardly varies before and after the heat treatment for crystallization. Amorphous silica particles soften even at about 800 to 1300° C. and may be bonded by fusion or sintering. However, the silica particles of the present invention are made crystalline at a relatively low temperature (800 to 1300° C.), and thus do not soften like amorphous particles. Therefore, bonding by fusion or sintering at about 800 to 1300° C. can be sufficiently suppressed. In particular, bonding by fusion or sintering of particles is more likely to occur when the surface area ratio of the particles increases, that is, when the particle diameter decreases. However, since the silica particles of the present invention are crystalline, even when the average particle diameter is 1 Lm, they will not be bonded by fusion or sintering and will not be easily aggregated. Accordingly, when the silica particles of the present invention are used as a filler for a semiconductor sealing material or the like, their fluidity, dispersibility and filling property can be increased.

Further, the temperature at which the particles are fused or sintered together varies depending on the particle diameter of the raw material amorphous spherical silica as well as kind and amount of additive components. Therefore, it is desirable to perform heat treatment at an appropriate temperature that does not cause fusion or sintering even within the temperature range of 800 to 1300° C., depending on the respective raw material and additive components.

The silica particles of the present invention are spherical. The means for making the particles spherical is not particularly limited and means such as pulverization and polishing may be used. In particular, the means for spraying before crystallization is highly productive and can make the particles spherical at low cost. Spherical silica particles have a high fluidity, dispersibility and filling property when used as a filler for a semiconductor sealing material, etc., and can also suppress wear of a device for producing a sealing material.

The silica particles of the present invention may have an average circularity of 0.88 or more, preferably 0.90 or more. The circularity can be measured by a commercially available flow type particle image analyzer. Moreover, it can be obtained as follows by using image analysis processing software from micrographs, such as from a scanning electron microscope (SEM). Take a picture of a sample of silica particles and measure an area and perimeter of the silica particles (two-dimensional projection view). Assuming that the silica particle is a perfect circle, the circumference of the perfect circle having the measured area is calculated. The circularity is obtained by the formula: circularity=circumference/perimeter length. When the circularity=1, it is a perfect circle. That is, the closer the circularity is to 1, the closer to a perfect circle. The average circularity is calculated as an average value of circularity measured for 100 or more particles. When the average circularity is less than 0.88, fluidity, dispersibility and filling property are not sufficient when used as a filler for semiconductor sealing materials, etc., and wear of a device for producing a sealing material may be accelerated.

Although the upper limit of the circularity may be 1.0, it is practically difficult to actually set the circularity to 1.0, and if it is to be realized, the manufacturing cost and the management cost become high. Depending on the application, etc., the upper limit of the circularity may be 0.98, preferably 0.95.

In order to obtain the above average circularity, it is possible to adjust the circularity of amorphous spherical silica particles (particles before crystallization). As for a thermal spraying means, a silica powder can be easily made into particles with high circularity. The average circularity of the silica particles of the present invention hardly decreases between before and after the heat treatment for crystallization. This is because the silica particles of the present invention are made crystalline at a relatively low temperature (800 to 1300° C.), and the circularity hardly decreases in this temperature range. In addition, amorphous silica particles may be bonded by fusion or sintering at about 800 to 1300° C. However, the silica particles of the present invention are made crystalline (not amorphous any more) at a relatively low temperature (800 to 1300° C.). Therefore, the bonding by fusion or sintering at about 800 to 1300° C. is sufficiently suppressed. When bonded, the circularity decreases, but bonding of the silica particles of the present invention to each other is sufficiently suppressed, and thus the average circularity hardly decreases. Accordingly, when the silica particles of the present invention are used as a filler for a semiconductor sealing material, their fluidity, dispersibility and filling property can be increased.

The details of the production method of the present invention will be described below. The spherical crystalline silica particles of the present invention can be produced by a method comprising the following steps. That is, the production method of the present invention comprises steps of:

mixing amorphous spherical silica particles with an alkaline metal compound or alkaline earth metal compound in a proportion of the alkaline metal in an amount of 0.4 to 5% by mass or the alkaline earth metal in an amount of 1 to 5% by mass in terms of oxide thereof, based on the total mass of the mass of the spherical silica particles and the mass of the alkaline metal or alkaline earth metal in terms of oxide thereof, heat treating the mixed spherical silica particles at 800 to 1300° C., and cooling the heat treated spherical silica particles. The spherical crystalline silica particles produced by this method contain 90% by mass or more of a crystal phase, and the content of a quartz crystal is 70% by mass or more with respect to the total mass of the particles.

The spherical silica particles are desirably heat-treated in a container that does not react with silica particles, such as one made from alumina. The heat treatment is performed by heating to a predetermined temperature using, for example, an electric furnace or a gas furnace. It is desirable to perform cooling while controlling the cooling rate.

In addition, since the heat treatment conditions for producing a large amount of quartz crystals vary depending on the type and added amount of alkali metal or alkaline earth metal. Therefore, it is possible that a suitable heat treatment temperature and holding time are selected depending on the type and added amount of alkali metal or alkaline earth metal to obtain the spherical crystalline silica particles of the present invention.

The amorphous spherical silica particles as the raw material can be produced by a method such as a thermal spraying method. For example, in the thermal spraying method, a silica powder that has been pulverized to adjust to have a desired particle diameter is passed through a flame, whereby the particles are melted and the shape of the particles becomes spherical due to their surface tension.

Further, the silica powder may be prepared so that the silica powder before spraying contains 50 to 5000 ppm of aluminum. Without being bound by a specific theory, it is believed that aluminum acts as a crystal nucleating agent during heat treatment. Through the thermal spraying process (melting), aluminum is uniformly dispersed in the silica particles. Aluminum is considered to act as a crystal nucleating agent during the subsequent heat treatment process, and by being uniformly dispersed in the silica particles, crystal growth can be achieved evenly and at a lower temperature and in a shorter time than before.

Also, alumina made by oxidizing aluminum can be expected to increase the chemical durability (acid resistance, etc.) of silica particles. If the aluminum content is less than 50 ppm, the effect of promoting crystallization and the effect of improving chemical durability may not be sufficient. On the other hand, aluminum or alumina is also known to reduce the melting point of silica. For example, the melting point of alumina silica glass is lower than that of pure silica glass. Therefore, when the aluminum content exceeds 5000 ppm, the melting point of the silica particles decreases, and the silica particles are easily bonded to each other by fusion or sintering during the heat treatment. When the bonding between the particles proceeds, when used as a filler for a semiconductor sealing material, their fluidity, dispersibility and filling property are not sufficient, and wear of a device for preparing the sealing material is promoted. Moreover, high purity is generally required for the semiconductor sealing material, and it may not be appropriate to add 5000 ppm or more of aluminum.

Also, the presence of aluminum is particularly effective when an alkaline earth metal is added for crystallization. For example, spherical crystalline silica particles containing a large amount of quartz crystals can be obtained by mixing calcium with amorphous silica particles containing aluminum within the scope of the present invention, followed by heat treatment.

Further, the content of aluminum can be measured by, for example, atomic absorption spectrometry or ICP mass spectrometry (ICP-MS).

The content of aluminum does not change even in the heat treatment stage for crystallization. Further, the mass of the silica particles between before and after the heat treatment hardly changes. For this reason, the effect of promoting crystallization can be obtained by using spherical silica particles containing 50 to 5000 ppm of aluminum.

The particles after thermal spraying may be subject to a rapid cooling so that the melted spheroidized particles do not fuse to each other. In this case, since they are rapidly cooled from the molten state, the spherical silica particles have no crystal structure but an amorphous structure. Since the spherical silica particles are thermally sprayed, they may be non-porous. Non-porous spherical silica particles are dense and are expected to have a high thermal conductivity.

The spherical silica particles obtained by thermal spraying may have an average particle diameter (D50) of 1 to 100 µm. In the subsequent heating and cooling steps for crystallization, the maximum temperature is about 1300° C., and thus the particle diameter of the spherical silica particles hardly changes. With a spraying means, a particle diameter can be easily adjusted. For this reason, in the method of the present invention, spherical crystalline silica particles having a desired average particle diameter can be easily realized.

The spherical silica particles obtained by thermal spraying may have an average circularity of 0.88 or more. In the subsequent heating and cooling steps for crystallization, the maximum temperature is about 1300° C., and thus the circularity of the spherical silica particles hardly changes. With a spraying means, particles with a high average circularity can be easily obtained. For this reason, in the method of the present invention, spherical crystalline silica particles having a desired high degree of circularity can be easily realized.

Spherical crystalline silica particles can be obtained by heat-treating a mixture of amorphous spherical silica particles with an alkaline metal compound or alkaline earth metal compound in a proportion of the alkaline metal in an amount of 0.4 to 5% by mass or the alkaline earth metal in an amount of 1 to 5% by mass in terms of oxide thereof, based on the total mass of the mass of the spherical silica particles and the mass of the alkaline metal or alkaline earth metal in terms of oxide thereof, and cooling the heat treated spherical silica particles.

The alkali metal and alkaline earth metal mixed with the amorphous spherical silica particles are not particularly limited in the form during addition, and can be an oxide, carbonate, hydroxide, nitrate or the like. As long as it is uniformly mixed with amorphous spherical silica particles, it can be added in the form of powder or aqueous solution.

When an alkali metal is added, it is desirable to use Li. When using Li, it is desirable to use $CaCO_3$ which is a carbonate. $LiCO_3$ is relatively easy to handle because it has low solubility and low safety hazards when mixed with water. $LiCO_3$ melts at 710° C., but is considered to react with $SiO_2$ at a temperature equal to or lower than its melting point and be taken into the $SiO_2$ particles. By incorporating Li into $SiO_2$ at such a low temperature, an effect of promoting crystallization at a low temperature can be obtained.

When an alkaline earth metal is added, it is desirable to use Ca. When using Ca, it is desirable to use $CaCO_3$ which is a carbonate or $Ca(OH)_2$ which is a hydroxide. $CaCO_3$ and $Ca(OH)_2$ are relatively easy to handle, because they are chemically stable and have a low safety risk as compared to the oxide CaO, In addition, when $CaCO_3$ or $Ca(OH)_2$ is used, $Ca(OH)_2$ is decomposed to CaO at the decomposition temperature of as low as 580° C. as compared to $CaCO_3$ of which decomposition temperature is 825° C. For this reason, it is thought that the use of $Ca(OH)_2$ makes it easy to form CaO at a low temperature and the effect of promoting crystallization can be obtained, and the effect of crystallization to quartz, which is a low-temperature type crystal of silica, can be obtained.

The heat treatment of a mixture of amorphous spherical silica particles and an alkali metal compound or alkaline earth metal compound, depending on the particle diameter of amorphous spherical silica, and the type and amount of alkali metal or alkaline earth metal to be added, is carried out under the conditions suitable for crystallization and holding of the spherical shape. The heat treatment temperature can be selected, for example, in the range of 800 to 1300° C. The holding time can also be selected, for example, in the range of 1 to 24 hours. Further, the heating and cooling can be carried out at a rate in the range of 100 to 300° C./hr. When the cooling rate is less than 100° C./hr, the cooling time becomes long, and the thus productivity may not be sufficient. When the cooling rate is more than 300° C./hr, the cooling rate is too high, and thus cracks may occur in the particles. The cooling rate may be applied to a temperature range lower than 500° C. or may be applied to room temperature. This is because in the temperature range lower than 500° C., crystallinity, particle diameter and circularity of the particles hardly change.

The cooled spherical crystalline silica particles contain a crystal phase in an amount of 90% by mass or more. Further, they contain 70% by mass or more of quartz crystals based on the total mass of the particles. The crystalline silica particles have a higher thermal conductivity than amorphous silica. When silica particles are used as a filler for a semiconductor sealing material, crystalline silica having a high thermal conductivity is useful in order to escape a large amount of heat generated by the semiconductor device.

EXAMPLES

Hereinafter, the present invention will be described in more detail with reference to examples and comparative examples. However, the present invention is not construed as being limited to the following examples.

[Example of Using Lithium Carbonate as an Alkali Metal Compound]

Amorphous spherical silica particles containing 97 ppm and 4564 ppm Al in terms of metallic aluminum were mixed with lithium carbonate, and the temperature was raised to 1000° C. at a temperature rising rate of 100 to 300° C./hr in the atmosphere. After holding the temperature at 1000° C. for six hours, they were cooled to room temperature at a temperature dropping rate of 100 to 300° C./hr. The obtained silica particles are shown in Tables 1 and 2.

Circularity was measured using a flow type particle image analyzer "FPIA-3000" manufactured by Sysmex.

For the crystallization rate, the integrated areas of the amorphous peak and the crystalline peak were determined by X-ray diffraction, and the ratio of the crystalline areas was defined as the crystallization ratio. That is, the crystallization ratio was calculated as the integrated area of the crystalline peak/(the integrated area of the amorphous peak+ the integrated area of the crystalline peak). Similarly, the ratios of amorphous phase, cristobalite, quartz, tridymite and other crystals were calculated.

The average particle diameters (D50) of the raw material and after heat treatment were measured using a laser diffraction particle size distribution analyzer (CILAS920 manufactured by CILAS). Incidentally, D50 is also referred to as a median diameter, and is a particle diameter at which the cumulative weight % is 50%.

The impurity contents of the raw material and after heat treatment were measured by an atomic absorption method on a sample aqueous solution obtained by thermally decomposing a sample with an acid.

In all of the examples according to the present invention, the crystallization ratio was 90% by mass or more of the entire particles, and crystalline spherical silica particles containing quartz in an amount of 70% by mass or more of the entire particles were obtained.

Further, the particles of the examples according to the present invention had a circularity of 0.90 to 0.95. The average particle diameter of the raw material of amorphous spherical silica particles containing 97 ppm Al in terms of metallic aluminum was 11.6 μm, whereas the average diameter of the particles according to the present invention using this raw material were from 13.2 to 15 μm. In addition, although the amorphous spherical silica particles containing 4564 ppm of Al in terms of metallic aluminum had an average diameter of 9.0 μm, the particles according to the present invention using this raw material had an average diameter of 11.1 to 13.5 μm.

TABLE 1

| | | | Comparative Example | Example | Example | Example | Example | Example | Example | Comparative Example |
|---|---|---|---|---|---|---|---|---|---|---|
| | | | \multicolumn{8}{c|}{Sample No.} |
| | | | 1 | 2 | 3 | 4 | 5 | 6 | 7 | 8 |
| Al content | | ppm | 97 | 97 | 97 | 97 | 97 | 97 | 97 | 97 |
| Additive | Component | | $Li_2CO_3$ | $Li_2CO_3$ | $Li_2CO_3$ | $Li_2CO_3$ | $Li_2CO_3$ | $Li_2CO_3$ | $Li_2CO_3$ | $Li_2CO_3$ |
| | Amount of Addition | wt % (in terms of oxide) | 0.2 | 0.4 | 0.5 | 0.4 | 0.5 | 4.0 | 5.0 | 6.0 |
| Heat Treatment | Holding | ° C. | 1000 | 1000 | 1000 | 1000 | 1000 | 1000 | 1000 | 1000 |
| | | h | 6 | 6 | 6 | 6 | 6 | 6 | 6 | 6 |
| | Temp. Rising/Dropping Rate | ° C./h | 100 | 100 | 100 | 300 | 300 | 100 | 100 | 300 |
| Constitutional Phase | Amorphous | wt % | — | — | — | — | — | — | — | — |
| | Cristbalite | wt % | 23.8 | 4.6 | 2.7 | 4.2 | 3.3 | 9.6 | 9.2 | 8.4 |
| | Quartz | wt % | 67.9 | 93.6 | 95.1 | 93.9 | 95.3 | 75.2 | 71.1 | 67.9 |
| | Tridymite | wt % | 1.6 | 0.0 | 0.2 | 1.1 | 0.0 | 0.0 | 0.0 | 0.2 |
| | Other Crystals | wt % | 6.7 | 1.8 | 2.0 | 0.8 | 1.4 | 15.2 | 19.7 | 23.5 |

TABLE 2

| | | | Example | Comparative Example | Example | Example | Example | Example | Example | Example | Comparative Example |
|---|---|---|---|---|---|---|---|---|---|---|---|
| | | | \multicolumn{9}{c|}{Sample No.} |
| | | | 9 | 10 | 11 | 12 | 13 | 14 | 15 | 16 | 17 |
| Al content | | ppm | 4564 | 4564 | 4564 | 4564 | 4564 | 4564 | 4564 | 4564 | 4564 |
| Additive | Component | | $Li_2CO_3$ | $Li_2CO_3$ | $Li_2CO_3$ | $Li_2CO_3$ | $Li_2CO_3$ | $Li_2CO_3$ | $Li_2CO_3$ | $Li_2CO_3$ | $Li_2CO_3$ |
| | Amount of Addition | wt % (in terms of oxide) | 1.0 | 0.2 | 0.4 | 0.5 | 0.4 | 0.5 | 4.0 | 5.0 | 6.0 |
| Heat Treatment | Holding | ° C. | 900 | 1000 | 1000 | 1000 | 1000 | 1000 | 1000 | 1000 | 1000 |
| | | h | 6 | 6 | 6 | 6 | 6 | 6 | 6 | 6 | 6 |
| | Temp. Rising/Dropping Rate | ° C./h | 300 | 100 | 100 | 100 | 300 | 300 | 100 | 100 | 100 |
| Constitutional Phase | Amorphous | wt % | 9.8 | 41.5 | — | — | — | — | — | — | — |
| | Cristbalite | Wt % | 1.9 | 17.6 | 12.2 | 20.3 | 17.1 | 20.0 | 12.8 | 7.1 | 11.3 |
| | Quartz | wt % | 86.4 | 12.9 | 84.2 | 74.8 | 80.6 | 78.0 | 72.1 | 70.3 | 67.4 |
| | Tridymite | wt % | 1.9 | 28.1 | 3.6 | 4.9 | 2.3 | 1.8 | 0.9 | 7.0 | 0.9 |
| | Other Crystals | wt % | — | — | — | — | — | 0.3 | 14.2 | 15.6 | 20.4 |

[Example of Using Calcium Carbonate as an Alkaline Earth Metal Compound]

Amorphous spherical silica particles containing 4564 ppm Al in terms of metallic aluminum and calcium carbonate were mixed, the resulting mixture was heated to 1100 to 1200° C. at a temperature rising rate of 300° C./hr in the atmosphere, held at 1100 to 1200° C. for 6 to 24 hours, and then it was cooled to room temperature at a temperature dropping rate of 300° C./hr. The obtained silica particles are shown in Table 3.

TABLE 3

| | | | Comparative Example | Example | Example | Example | Comparative Example |
|---|---|---|---|---|---|---|---|
| | | | \multicolumn{5}{c|}{Sample No.} |
| | | | 18 | 19 | 20 | 21 | 22 |
| Al content | | ppm | 4564 | 4564 | 4564 | 4564 | 4564 |
| Additive | Component | | $CaCO_3$ | $CaCO_3$ | $CaCO_3$ | $CaCO_3$ | $CaCO_3$ |
| | Amount of Addition | wt % (in terms of oxide) | 0.5 | 1.0 | 3.0 | 5.0 | 6.0 |
| Heat Treatment | Holding | ° C. | 1100 | 1100 | 1100 | 1200 | 1200 |
| | | h | 6 | 24 | 24 | 12 | 12 |
| | Temp. Rising/Dropping Rate | ° C./h | 300 | 300 | 300 | 300 | 300 |
| Constitutional Phase | Amorphous | wt % | 68.9 | 8.6 | 0.0 | 0.0 | 0.0 |
| | Cristbalite | wt % | 1.7 | 4.8 | 5.5 | 12.8 | 11.7 |
| | Quartz | wt % | 29.2 | 73.7 | 82.9 | 70.2 | 65.1 |

TABLE 3-continued

|  |  | Comparative Example | Example | Example | Example | Comparative Example |
|---|---|---|---|---|---|---|
|  |  | \multicolumn{5}{c}{Sample No.} |
|  |  | 18 | 19 | 20 | 21 | 22 |
| Tridymite | wt % | 0.2 | 8.7 | 6.9 | 2.0 | 2.4 |
| Other Crystals | wt % | — | 4.2 | 4.7 | 15.0 | 20.8 |

In all of the examples according to the present invention, the crystalline spherical silica particles having crystallization ratio of 90% by mass or more based on the total mass of the particles and containing 70% by mass or more of quartz based on the total mass of the particles were obtained.

Further, the particles of the examples according to the present invention had a circularity of 0.90 to 0.95. The average particle diameter of the raw material of amorphous spherical silica particles containing 97 ppm Al in terms of metallic aluminum was 11.6 μm, whereas the average diameter of the particles according to the present invention using this raw material had 12.8-to 14.1 km. In addition, although the amorphous spherical silica particles containing 4564 ppm of Al in terms of metallic aluminum had an average diameter of 9.0 μm, the particles according to the present invention using this raw material had an average diameter of 9.8 to 12.1 km.

[Example Using Calcium Hydroxide as an Alkaline Earth Metal Compound]

Amorphous spherical silica particles containing 4564 ppm Al in terms of metallic aluminum and calcium hydroxide were mixed, and the resulting mixture was heated to 1200° C. at a temperature rising rate of 300° C./hr in the atmosphere, held at 1200° C. for 6 to 24 hours, and then it was cooled to room temperature at a temperature dropping rate of 300° C./hr. The obtained silica particles are shown in Table 4.

The invention claimed is:

1. Spherical crystalline silica particles characterized in that:
   a content of a crystal phase is 90% by mass or more with respect to a total mass of the particles, and a content of a quartz crystal is 70% by mass or more with respect to the total mass of the particles;
   the spherical crystalline silica particles contain 0.4 to 5% by mass of at least one alkali metal in terms of oxide thereof with respect to the total mass of the particles; and
   the spherical crystalline silica particles contain 50 to 5000 ppm of aluminum in terms of metallic aluminum with respect to the total mass of the particles.

2. The spherical crystalline silica particles according to claim 1, characterized in that the alkali metal is Li.

3. The spherical crystalline silica particles according to claim 1, characterized in that they contain 1 to 5% by mass of at least one alkaline earth metal in terms of oxide thereof with respect to the total mass of the particles.

4. The spherical crystalline silica particles according to claim 3, characterized in that the alkaline earth metal is Ca.

5. The spherical crystalline silica particles according to claim 1, characterized in that their average particle diameter (D50) is from 1 to 100 μm.

6. The spherical crystalline silica particles according to claim 1, characterized in that their average circularity is 0.88 or more.

TABLE 4

|  |  |  | Comparative Example | Example | Example | Example | Example | Example |
|---|---|---|---|---|---|---|---|---|
|  |  |  | \multicolumn{6}{c}{Sample No.} |
|  |  |  | 23 | 24 | 25 | 26 | 27 | 28 |
| Al content |  | ppm | 4564 | 4564 | 4564 | 4564 | 4564 | 4564 |
| Additive | Component |  | Ca(OH)$_2$ | Ca(OH)$_2$ | Ca(OH)$_2$ | Ca(OH)$_2$ | Ca(OH)$_2$ | Ca(OH)$_2$ |
|  | Amount of Addition | wt % (in terms of oxide) | 2.0 | 3.0 | 4.0 | 2.0 | 1.0 | 2.0 |
| Heat Treatment | Holding | ° C. | 1200 | 1200 | 1200 | 1200 | 1200 | 1200 |
|  |  | h | 6 | 6 | 6 | 12 | 24 | 24 |
|  | Temp. Rising/ Dropping Rate | ° C./h | 300 | 300 | 300 | 300 | 300 | 300 |
| Constitutional Phase | Amorphous | wt % | 19.9 | 3.9 | 0.0 | 1.0 | 3.3 | 1.5 |
|  | Cristbalite | wt % | 11.7 | 18.9 | 16.3 | 24.2 | 26.2 | 28.2 |
|  | Quartz | wt % | 68.4 | 76.8 | 83.7 | 74.8 | 70.5 | 70.3 |
|  | Tridymite | wt % | 0.0 | 0.4 | 0.0 | 1.0 | 0.0 | 0.0 |
|  | Other Crystals | wt % | 0.0 | 0.0 | 0.0 | 0.0 | 0.0 | 0.0 |

In all of the examples according to the present invention, the crystalline spherical silica particles having crystallization ratio of 90% by mass or more based on the total mass of the particles and containing 70% by mass or more of quartz based on the total mass of the particles were obtained.

Further, the particles of the examples according to the present invention had a circularity of 0.91 to 0.95, and had an average particle diameter of 9.5 to 11.3 μm as compared to 9.0 μm of the raw material.

7. A mixture comprising the spherical crystalline silica paticles according to claim 1 and a resin.

8. A semiconductor sealing material comprising the mixture according to claim 7.

9. A method for producing the spherical crystalline silica particles according to claim 1, characterized in that it comprises steps of:
   mixing amorphous spherical silica particles with an alkaline metal compound in a proportion of the alkaline metal in an amount of 0.4 to 5% by mass in terms of oxide thereof, based on the total mass of the mass of the amorphous spherical silica particles and the mass of the alkaline metal in terms of oxide thereof, heat treating the mixed spherical silica particles at 800 to 1300° C., and cooling the heat treated spherical silica particles, wherein the cooled spherical silica particles contain 90% by mass or more of a crystal phase, and the content of a quartz crystal is 70% by mass or more with respect to the total mass of the particles.

10. The method for producing spherical crystalline silica particles according to claim 9, characterized in that the alkali metal is Li.

11. The method for producing spherical crystalline silica particles according to claim 10, characterized in that the alkali metal compound is $Li_2CO_3$.

12. Spherical crystalline silica particles, characterized in that:

a content of a crystal phase is 90% by mass or more with respect to a total mass of the particles, and a content of a quartz crystal is 70% by mass or more with respect to the total mass of the particles;

the spherical crystalline silica particles contain 0.4 to 5% by mass of at least one alkali metal in terms of oxide thereof with respect to the total mass of the particles, and the spherical crystalline silica particles contain 50 to 5000 ppm of aluminum in terms of metallic aluminum with respect to the total mass of the particles, wherein said at least one alkali metal is Li.

13. Spherical crystalline silica particles, characterized in that:

a content of a crystal phase is 90% by mass or more with respect to a total mass of the particles, and a content of a quartz crystal is 70% by mass or more with respect to the total mass of the particles;

the spherical crystalline silica particles contain 1 to 5% b mass of at least one alkaline earth metal in terms of oxide thereof with respect to the total mass of the particles; and the spherical crystalline silica particles contain 50 to 5000 ppm of aluminum in terms of metallic aluminum with respect to the total mass of the particles.

14. A method for producing the spherical crystalline silica particles according to claim 13, characterized in that it comprises steps of:

mixing amorphous spherical silica particles with an alkaline earth metal compound in a proportion of the alkaline earth metal in an amount of 1 to 5% by mass in terms of oxide thereof, based on the total mass of the mass of the amorphous spherical silica particles and the mass of the alkaline earth metal in terms of oxide thereof, heat treating the mixed spherical silica particles at 800 to 1300° C., and cooling the heat treated spherical silica particles, wherein the cooled spherical silica particles contain 90% by mass or more of a crystal phase, and the content of a quartz crystal is 70% by mass or more with respect to the total mass of the particles.

15. The method for producing spherical crystalline silica particles according to claim 14, characterized in that the alkaline earth metal is Ca.

16. The method for producing spherical crystalline silica particles according to claim 15, characterized in that the alkaline earth metal compound is $CaCO_3$ or $Ca(OH)_2$.

17. The method for producing spherical crystalline silica particles according to claim 9, characterized in that the amorphous spherical silica particles containing 50 to 5000 ppm of aluminum in terms of metallic aluminum are used.

18. The method for producing spherical crystalline silica particles according to claim 9, characterized in that the spherical crystalline silica particles are produced so that their average particle diameter (D50) is from 1 to 100 μm.

19. The method for producing spherical crystalline silica particles according to claim 9, wherein the spherical crystalline silica particles are produced so that their average circularity is 0.88 or more.

* * * * *